US006932259B2

(12) United States Patent
Chen et al.

(10) Patent No.: US 6,932,259 B2
(45) Date of Patent: Aug. 23, 2005

(54) BRITTLE MATERIAL BREAKING APPARATUS

(75) Inventors: Kuei-Jung Chen, Miaoli (TW); Meng-Chun Chen, Tainan (TW); Chih-Ming Chen, Taichung (TW); Chih-Yi Lai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 4 days.

(21) Appl. No.: 10/782,913

(22) Filed: Feb. 23, 2004

(65) Prior Publication Data

US 2005/0121486 A1 Jun. 9, 2005

(30) Foreign Application Priority Data

Dec. 3, 2003 (TW) .............................. 92134086 A

(51) Int. Cl.[7] .............................................. B26F 3/00
(52) U.S. Cl. ..................... 225/104; 225/96.5; 225/103; 225/105
(58) Field of Search ................................ 225/104, 105, 225/103, 96.5, 96, 2; 125/23.01, 23.02, 35; 438/33, 68, 113, 458, 460–465

(56) References Cited

U.S. PATENT DOCUMENTS

| 3,326,071 | A | * | 6/1967 | Bushman et al. ............. 83/880 |
| 3,601,296 | A | * | 8/1971 | Pick et al. .................. 225/103 |
| 4,296,542 | A | * | 10/1981 | Gotman ...................... 438/464 |
| 4,653,680 | A | * | 3/1987 | Regan ........................ 225/104 |
| 4,688,540 | A | * | 8/1987 | Ono ........................ 125/13.01 |
| 4,948,025 | A | * | 8/1990 | Lisec ........................ 225/104 |
| 5,165,585 | A | * | 11/1992 | Lisec ........................ 225/105 |
| 5,174,188 | A | * | 12/1992 | Petroz ........................ 225/96 |
| 5,820,006 | A | | 10/1998 | Turner |
| 5,873,922 | A | * | 2/1999 | Lisec .......................... 65/112 |
| 6,782,883 | B2 | * | 8/2004 | Chen et al. ............. 125/23.01 |

* cited by examiner

Primary Examiner—Stephen Choi

(57) ABSTRACT

A brittle material breaking apparatus using a lifting mechanism to lift/lower a carrier wherein the lifting mechanism is controlled to lift the carrier for holding the brittle material for breaking, and then to lower the carrier from the brittle material to a distance for enabling the brittle material to be shifted to a next scribe line for further breaking, preventing the occurrence of friction between the brittle material and the carrier and the production of static electricity and micro particles and, improving the breaking quality. The brittle material breaking apparatus further includes a stroke fine adjustment mechanism adapted to adjust the stroke of the breaking-cutter relative to the brittle material.

20 Claims, 3 Drawing Sheets

BRITTLE MATERIAL BREAKING APPARATUS

BACKGROUND OF THE INVENTION

1. Field of the Invention

The present invention relates to an apparatus for breaking of brittle material and, more specifically, to an apparatus adapted to break semiconductor wafers along scribe lines scribed on the semiconductor wafers.

2. Description of Related Art

Various equipments are requisite in a foundry during the fabrication of semiconductor wafers. In order to improve the precision and reduce the production of micro particles, apparatus for scribing and/or breaking semiconductor wafers must be maintained clean.

When breaking a semiconductor wafer according to a conventional manufacturing process, the semiconductor wafer is adhered to a thin film and then scribed with transverse and longitudinal scribe lines on the surface, and then the scribed semiconductor wafer is put on the wafer breaking apparatus, and then the breaking-cutter of the wafer breaking apparatus is lifted to break the semiconductor wafer at one of the scribe lines, and then the semiconductor wafer is shifted to a predetermined distance for enabling the breaking-cutter to break the semiconductor wafer at a second scribe line. This breaking action is repeated again and again to complete breaking of the semiconductor wafer.

During the aforesaid conventional semiconductor wafer breaking operation, the semiconductor wafer is directly carried on and maintained in contact with the semiconductor wafer breaking apparatus. When shifting the semiconductor wafer, friction is produced between the bottom surface of the thin film at the semiconductor wafer and the top side of the semiconductor wafer breaking apparatus. This friction increases the risk of scratching damage to the semiconductor wafer and the possibility of the production of static electricity or micro particles, affecting the semiconductor wafer breaking quality. U.S. Pat. No. 5,820,006, entitled "Apparatus for scribing and/or breaking semiconductor wafers" is an example of the aforesaid prior art design.

SUMMARY OF THE INVENTION

The present invention has been accomplished under the circumstances in view. It is the main object of the present invention to provide a brittle material breaking apparatus, which prevents friction between the brittle material and the brittle material breaking apparatus, improving the breaking quality. It is another object of the present invention to provide a brittle material breaking apparatus, which has means for adjusting of the stroke of the breaking-cutter relative to the brittle material.

To achieve these and other objects of the present invention, the brittle material breaking apparatus is adapted to break a brittle material that has been scribed with a plurality of scribe lines thereon, and the apparatus comprising a base frame, a lifting mechanism, and a breaking-cutter module. The base frame comprises two parallel sliding grooves extended in vertical direction. The lifting mechanism comprises two parallel sliding rails, a transverse plate, and a driving module. The sliding rails extended in vertical direction and adapted to slide along the sliding grooves respectively, the transverse plate affixed between the sliding rails, and the driving module adapted to drive the transverse plate and the sliding rails sliding along the sliding grooves vertically. The breaking-cutter module comprises a carrier, a driving mechanism, and a cutter assembly. The carrier mounted between the sliding rails of the lifting mechanism, the carrier comprising a central cutter slot, the driving mechanism mounted on the carrier, and the cutter assembly comprising a cutter holder, and a breaking-cutter. The cutter holder mounted on the driving mechanism and adapted to be lifted by the driving mechanism, and the breaking-cutter mounted on the cutter holder and adapted to be protruded through the central cutter slot to break one of the scribe lines of the brittle material upon upward movement of the cutter holder by the driving mechanism of the breaking-cutter module.

When wishing to break the brittle material, the apparatus is set below the brittle material, and then the lifting mechanism is controlled to lift the carrier for enabling the carrier to hold the brittle material by vacuum for breaking, and then the cutter holder is slid vertically upwards to lift the breaking-cutter through the central cutter slot of the carrier to force the cutting edge against one of the scribe lines of the brittle material. After the breaking of one of the scribe lines of the brittle material, the lifting mechanism is controlled to lower the carrier from the brittle material, and then the brittle material is shifted to a next scribe line for breaking, and then the lifting mechanism is controlled to lift the carrier again, for enabling the breaking-cutter module to break the brittle material again.

When shifting the brittle material from one scribe line to another during the aforesaid breaking-cutting operation, the lifting mechanism is controlled to lower the carrier from the brittle material at first, therefore shifting the brittle material from one scribe line to another does not cause friction between the brittle material breaking apparatus and the brittle material.

The driving mechanism of the breaking-cutter module comprises a fixed member, a movable member, and an air cylinder, the fixed member fixedly mounted on the carrier, the movable member coupled to and adapted to slide along the fixed member, and the air cylinder mounted on the movable member. The breaking-cutter module further comprises a stroke fine adjustment mechanism installed in the carrier. The stroke fine adjustment mechanism comprises a cam shaft, and a motor, the cam shaft coupled to the movable member of the driving mechanism of the breaking-cutter module, and the motor adapted to rotate the cam shaft and to further adjust vertical moving distance of the movable member relative to the fixed member so as to relatively adjust the moving distance of the cutter holder with the air cylinder relative to the brittle material.

DETAILED DESCRIPTION OF THE PREFERRED EMBODIMENT

Figure 3:
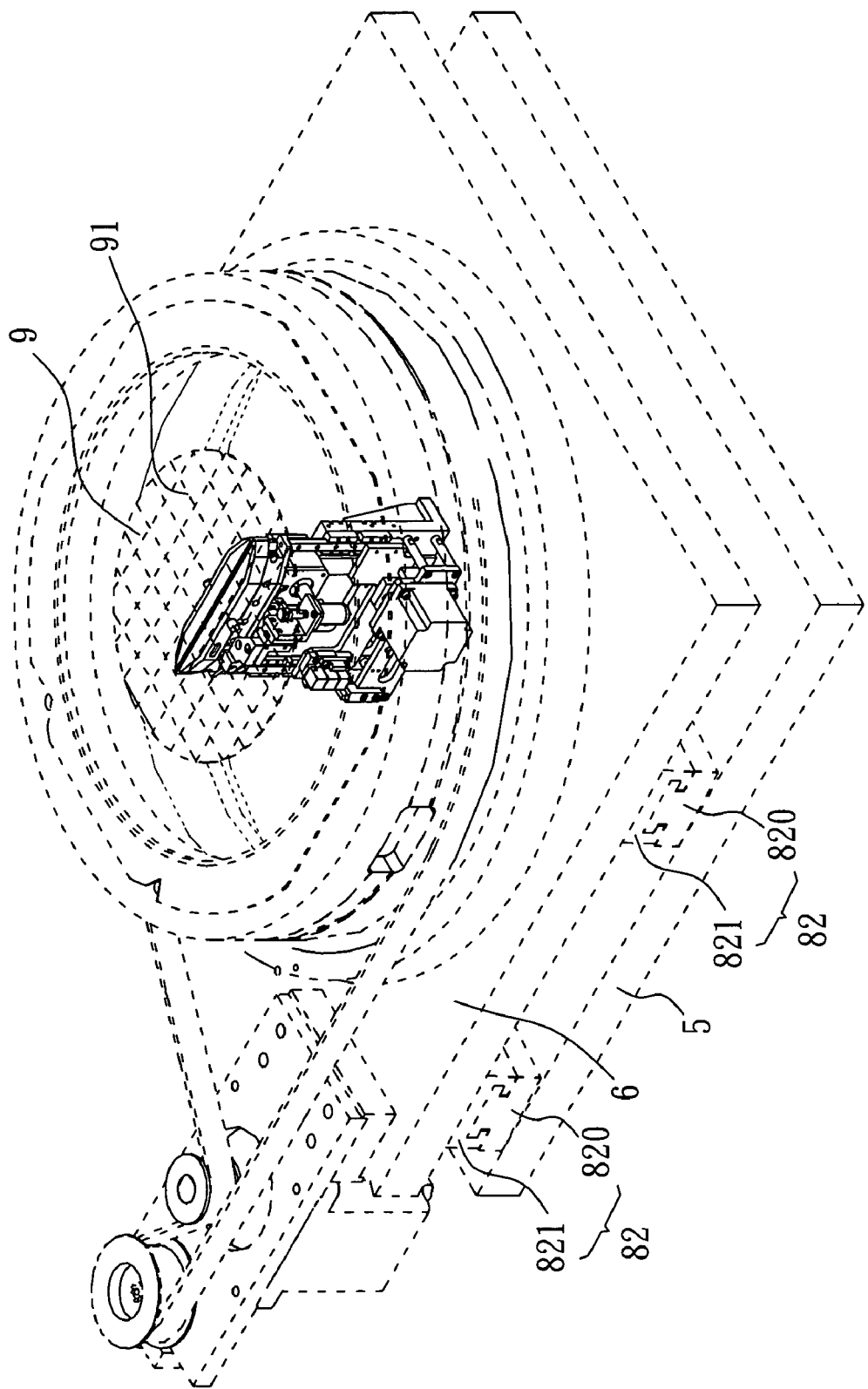
FIG. 3 is an applied view of the present invention.

FIG. 3 is an applied view of the present invention for breaking of a brittle material 9 that has been scribed with a plurality of scribe lines 91 thereon. The brittle material 9 is adhered to a thin film carried on a rotary table 6 and maintained at a predetermined height. According to this embodiment, the brittle material 9 is a semiconductor wafer.

The rotary table 6 is carried on a sliding table assembly 82. The sliding table assembly 82 comprises a sliding rail unit 820 affixed to a flat base plate 5 and extended in longitudinal direction, and a sliding block unit 821 affixed to the bottom side of the rotary table 6 and slidably coupled to the sliding rail unit 820 for enabling the brittle material 9 and the rotary table 6 to be slid with the sliding block unit 821 along the sliding rail unit 820 so that the brittle material 9 can be broken by the apparatus of the present invention.

Figure 1:
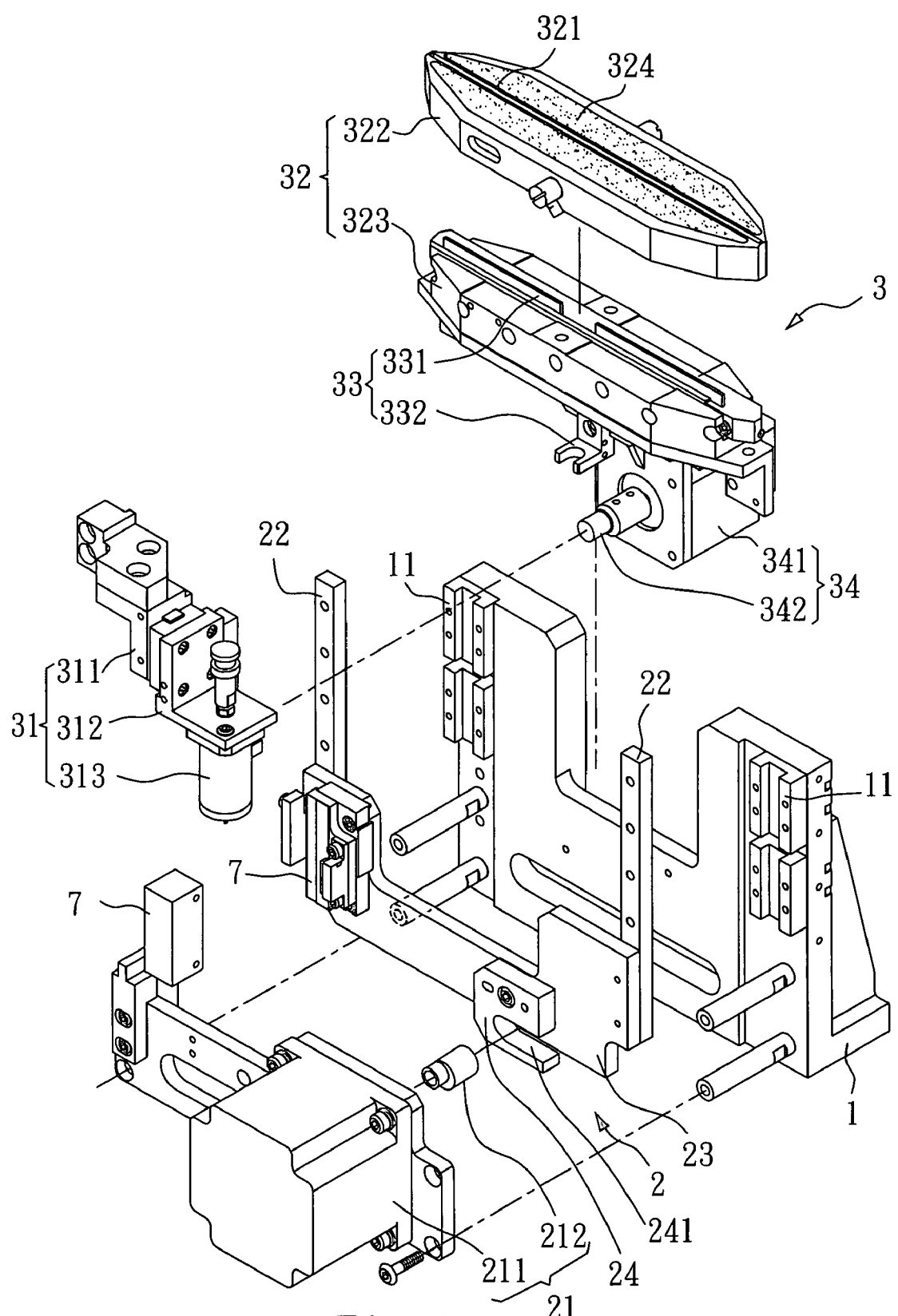
FIG. 1 is an exploded view of a brittle material breaking apparatus according to the present invention.
Figure 2:
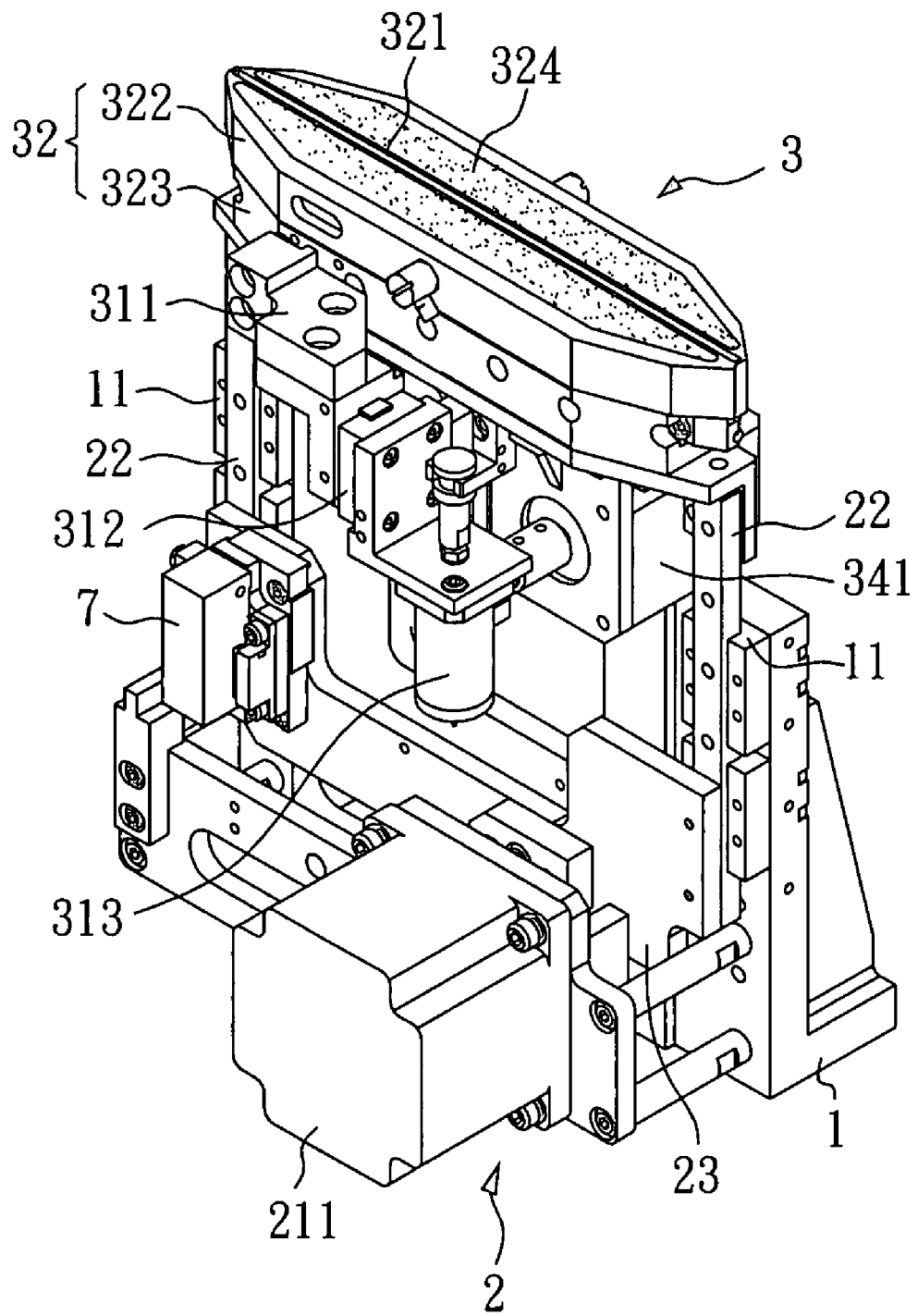
FIG. 2 is a perspective assembly view of the brittle material breaking apparatus according to the present invention.

Referring to FIGS. 1 and 2, the brittle material breaking apparatus of the present invention is vertically spaced below the brittle material 9, comprising a base frame 1, a lifting mechanism 2, and a breaking-cutter module 3. The base frame 1 has two vertical sliding grooves 11 extended in vertical direction and arranged in parallel.

The lifting mechanism 2 comprises a driving module 21, two parallel vertical sliding rails 22, and a transverse plate 23. The driving module 21 comprises a motor 211, a cam shaft 212, and a cam shaft linker 24. The cam shaft linker 24 is fixedly mounted on the transverse plate 23, having a mating slot 241 adapted to support the cam shaft 212. The cam shaft 212 is an eccentric shaft rotated in the mating slot 241 of the cam shaft linker 24 to drive the cam shaft linker 24 and the transverse plate 23 alternatively up and down. The transverse plate 23 is fixedly fastened between the respective lower parts of the vertical sliding rails 22. The vertical sliding rails 22 are respectively coupled to and slidably along the vertical sliding grooves 11. The motor 211 of the driving module 21 is fixedly mounted on the base frame 1, and adapted to rotate the cam shaft 212 by the eccentric function, causing the vertical sliding rails 22 to be slid with the transverse plate 23 vertically along the vertical sliding grooves 11. As shown in FIG. 1, the base frame 1 can be provided between the motor 211 and the two vertical sliding rails 22, the motor 211 can be directly affixed to the base frame 1, the transverse plate 23 and the two vertical sliding grooves 11 can respectively be disposed at the other side of the vertical sliding rails 22 and the other side of the base frame 1.

The breaking-cutter module 3 comprises a driving mechanism 31, a carrier 32, and a cutter assembly 33. The driving mechanism 31 further comprises a fixed member 311, a movable member 312, and an air cylinder 313. The carrier 32 further comprises a carrier base 323 and a vacuum base 322. The cutter assembly 33 further comprises a cutter holder 332, and a breaking-cutter 331.

The fixed member 311 of the driving mechanism 31 is mounted on the carrier base 323 of the carrier 32. The movable member 312 of the driving mechanism 31 is slidably mounted on the fixed member 311. The air cylinder 313 of the driving mechanism 31 is mounted on the movable member 312. The cutter holder 332 of the cutter assembly 33 is coupled to the air cylinder 313 of the driving mechanism 31. The breaking-cutter 331 is mounted on the cutter holder 332. The vacuum base 322 of the carrier 32 is mounted on the carrier base 323. The carrier base 323 is mounted between the respective upper parts of the two vertical sliding rails 22 of the lifting mechanism 2. The vacuum base 322 has a central cutter slot 321 on the middle.

When wishing to break the brittle material 9, the lifting mechanism 2 is controlled to lift the carrier 32 for enabling the vacuum base 322 of the carrier 32 to hold the brittle material 9 for breaking, and then the air cylinder 313 of the driving mechanism 31 is operated to move the cutter holder 332 vertically upwards so as to lift the breaking-cutter 331 protruded through the central cutter slot 321 of the vacuum base 322 over the top side of the vacuum base 322 and to force the cutting edge of the breaking-cutter 331 against one of the scribe lines 91 of the brittle material 9. After the aforesaid action, the lifting mechanism 2 is controlled to lower the carrier 32, and then the rotary table 6 is slid along the sliding block unit 821 to let the next scribe line 91 of the brittle material 9 be aimed at the cutting edge of the breaking-cutter 331, and then the lifting mechanism 2 is controlled to lift the carrier 32 again, for enabling the brittle material 9 to be hold on the vacuum base 322 of the carrier 32 again, and then the air cylinder 313 of the driving mechanism 31 is controlled to lift the breaking-cutter 331 protruded through the central cutter slot 321 of the vacuum base 322 over the top side of the vacuum base 322 again, and to force the cutting edge of the breaking-cutter 331 against the second scribe line 91 of the brittle material 9, and thus the second breaking-cutting action of the brittle material 9 is done.

The aforesaid breaking-cutting action is repeated again and again to complete the breaking operation of the brittle material 9. Because the scribe lines 91 of the brittle material 9 include transverse scribe lines and longitudinal scribe lines, the rotary table 6 (see FIG. 3) can be operated to rotate the brittle material 9 through 900 angle, and then the aforesaid breaking-cutting action is repeated again and again to complete transverse and longitudinal breaking operation of the brittle material 9.

When shifting the brittle material 9 from one scribe line to another during the aforesaid breaking-cutting operation, the lifting mechanism 2 is controlled to lower the carrier 32 at first, at this time the brittle material 9 is maintained at the original elevation, keeping the brittle material 9 spaced above the carrier 32 and the vacuum base 322 at the predetermined height, and therefore no direct friction is produced between the brittle material 9 and the vacuum base 322 during shifting of the brittle material 9. Because the brittle material 9 is kept away from the vacuum base 322 during shifting, shifting the brittle material 9 from one scribe line 91 to another does not cause a scratching damage and friction loss to the brittle material 9, or produce static electricity or particles due to friction. Therefore, the present invention improves the quality of the breaking of brittle materials. Further, the motor 211 of the aforesaid lifting mechanism 2 can be computerized to achieve precision positioning.

A displacement sensor 7 may be mounted on the base frame 1 and the transverse plate 23 of the lifting mechanism 2 to detect the sliding distance of the lifting mechanism 2 relative to the base frame 1. Further, two porous ceramic plates 324 are mounted on the vacuum base 322 of the carrier 32. The porous ceramic plates 324 each have a plurality of capillaries. After putting of the brittle material 9 to be broken on the vacuum base 322, air is drawn away from the capillaries of the porous ceramic plates 324, thereby causing the brittle material 9 to be smoothly and positively secured to the vacuum base 322 by a vacuum force.

The breaking-cutting module 3 further comprises a stroke fine adjustment mechanism 34 mounted on the carrier base 323 of the carrier 32. The stroke fine adjustment mechanism 34 is comprised of a motor 341 and a cam shaft 342. The cam shaft 342 is a eccentric and coupled to the movable member 312 of the aforesaid driving mechanism 31. The motion between the cam shaft 342 and the movable member 312 is similar to the motion between the cam shaft 212 of the aforesaid lifting mechanism 2 and the cam shaft linker 24. The motor 341 is fixedly mounted on the carrier base 323 and controlled to rotate the cam shaft 342, adjusting the vertically slidably distance of the movable member 312 on the fixed member 311, i.e., rotating the cam shaft 342 causes a movement of the movable member 312 of the driving mechanism 31 relative to the fixed member 311, and the air cylinder 313 as well as the cutter holder 332 are followed. At this time, the stroke (moving distance) of the breaking-cutter 331 of the cutter assembly 33 relative to the brittle material 9 is relatively adjusted.

Although the present invention has been explained in relation to its preferred embodiment, it is to be understood that many other possible modifications and variations can be made without departing from the spirit and scope of the invention as hereinafter claimed.

What is claimed is:

1. A brittle material breaking apparatus for breaking of a brittle material that has been scribed with a plurality of scribe lines thereon, the apparatus comprising:
    a base frame, said base frame comprising two parallel sliding grooves extended in vertical direction;
    a lifting mechanism, said lifting mechanism comprising two parallel sliding rails, a transverse plate, and a driving module, wherein said sliding rails extended in vertical direction and adapted to slide along said sliding grooves respectively, said transverse plate affixed between said sliding rails, and said driving module adapted to drive said transverse plate and said sliding rails sliding along said sliding grooves vertically; and
    a breaking-cutter module, said breaking-cutter module comprising a carrier, a driving mechanism, and a cutter assembly, wherein said carrier mounted between the sliding rails of said lifting mechanism, said carrier comprising a central cutter slot, said driving mechanism mounted on said carrier, and said cutter assembly comprising a cutter holder, and a breaking-cutter, said cutter holder mounted on said driving mechanism and adapted to be lifted by said driving mechanism, and said breaking-cutter mounted on said cutter holder and adapted to be protruded through said central cutter slot to break one of the scribe lines of said brittle material upon upward movement of said cutter holder by the driving mechanism of said breaking-cutter module.

2. The brittle material breaking apparatus as claimed in claim 1, wherein the driving mechanism of said breaking-cutter module comprises a fixed member, a movable member, and an air cylinder, said fixed member fixedly mounted on said carrier, said movable member coupled to and adapted to slide along said fixed member, and said air cylinder mounted on said movable member.

3. The brittle material breaking apparatus as claimed in claim 2, wherein the cutter holder of said breaking-cutter module is coupled with the air cylinder of the driving mechanism of said breaking-cutter module.

4. The brittle material breaking apparatus as claimed in claim 3, wherein said breaking-cutter module further comprises a stroke fine adjustment mechanism installed in said carrier, said stroke fine adjustment mechanism comprising a cam shaft, and a motor, said cam shaft coupled to the movable member of the driving mechanism of said breaking-cutter module, and said motor adapted to rotate said cam shaft and to further adjust vertical moving distance of said movable member relative to said fixed member so as to relatively adjust the moving distance of said cutter holder with said air cylinder relative to said brittle material.

5. The brittle material breaking apparatus as claimed in claim 4, wherein the motor of said stroke fine adjustment mechanism is fixedly mounted on a carrier base of the carrier of said breaking-cutter module.

6. The brittle material breaking apparatus as claimed in claim 1, wherein said transverse plate is affixed between the respective lower parts of said sliding rails.

7. The brittle material breaking apparatus as claimed in claim 1, wherein the driving module of said lifting mechanism is fixedly mounted on said base frame.

8. The brittle material breaking apparatus as claimed in claim 1, wherein the carrier of said breaking-cutter module is mounted between the respective upper parts of said sliding rails.

9. The brittle material breaking apparatus as claimed in claim 1, wherein the driving module of said lifting mechanism further comprises a cam shaft linker, a cam shaft, and a motor, said cam shaft coupled to said cam shaft linker, and said motor adapted to rotate the cam shaft of the driving module of said lifting mechanism and to further drive said transverse plate and said sliding rails sliding along said sliding grooves.

10. The brittle material breaking apparatus as claimed in claim 9, wherein said cam shaft linker is fixedly mounted on said transverse plate.

11. The brittle material breaking apparatus as claimed in claim 9, wherein said cam shaft linker comprises a mating slot; the cam shaft of the driving module of said lifting mechanism is coupled to said mating slot and rotated to drive said cam shaft linker vertically up and down.

12. The brittle material breaking apparatus as claimed in claim 9, wherein the motor of said driving module of said lifting mechanism is fixedly mounted on said base frame.

13. The brittle material breaking apparatus as claimed in claim 9, wherein said base frame is provided in between the motor of said lifting mechanism and said sliding rails.

14. The brittle material breaking apparatus as claimed in claim 1, wherein a displacement sensor is installed in said base frame and said transverse plate and adapted to detect the sliding distance of said lifting mechanism relative to said base frame.

15. The brittle material breaking apparatus as claimed in claim 1, wherein said carrier comprises a carrier base, and a vacuum base mounted on said carrier base and adapted to hold said brittle material for breaking.

16. The brittle material breaking apparatus as claimed in claim 15, wherein said vacuum base has mounted thereon two porous ceramic plates adapted to hold said brittle material for breaking.

17. The brittle material breaking apparatus as claimed in claim 16, wherein said porous ceramic plates each comprise a plurality of capillaries.

18. The brittle material breaking apparatus as claimed in claim 1, wherein said brittle material is a semiconductor wafer.

19. The brittle material breaking apparatus as claimed in claim 1, which is affixed to a flat base plate.

20. The brittle material breaking apparatus as claimed in claim 1, wherein said transverse plate of said lifting mechanism and said sliding grooves are respectively disposed at said sliding rails and said base frame at one side opposite to the motor of said lifting mechanism.

* * * * *